United States Patent [19]

Sloan, Jr.

[11] 3,925,105

[45] Dec. 9, 1975

[54] PROCESS FOR FABRICATING INTEGRATED CIRCUITS UTILIZING ION IMPLANTATION

[75] Inventor: Benjamin Johnston Sloan, Jr., Richardson, Tex.

[73] Assignee: Texas Instruments Incorporated, Dallas, Tex.

[22] Filed: July 2, 1974

[21] Appl. No.: 485,200

[52] U.S. Cl. .................... 148/1.5; 145/187; 357/91

[51] Int. Cl.$^2$ .......................................... H01L 21/265

[58] Field of Search .......... 148/1.5, 187; 357/48, 91

[56] References Cited

UNITED STATES PATENTS

| | | | |
|---|---|---|---|
| 3,602,781 | 8/1971 | Hart | 148/1.5 X |
| 3,756,861 | 9/1973 | Payne et al. | 148/1.5 |
| 3,793,088 | 2/1974 | Eckton, Jr. | 148/1.5 |
| 3,853,634 | 12/1974 | Amelio et al. | 148/1.5 |

*Primary Examiner*—L. Dewayne Rutledge
*Assistant Examiner*—J. M. Davis
*Attorney, Agent, or Firm*—Harold Levine; James T. Comfort; Gary C. Honeycutt

[57] ABSTRACT

Fabrication of an integrated circuit structure including a buried collector, junction isolated structure in which only one silicon oxide removal step is required following growth of the epitaxial layer. Base, emitter, base contact, collector contact and isolation regions are defined by implantation of dopant ions using the silicon oxide layer and photoresist material as an implantation mask. Only one critical O. R. step is involved in defining areas for the emitter, base contact and collector contact regions in required alignment with previously formed base and isolation regions. The structure resulting from the process features a relatively flat silicon oxide surface suitable for single or multilevel metallization, improved packing density and high speed performance.

14 Claims, 6 Drawing Figures

PROCESS FOR FABRICATING INTEGRATED CIRCUITS UTILIZING ION IMPLANTATION

Figure 1A:
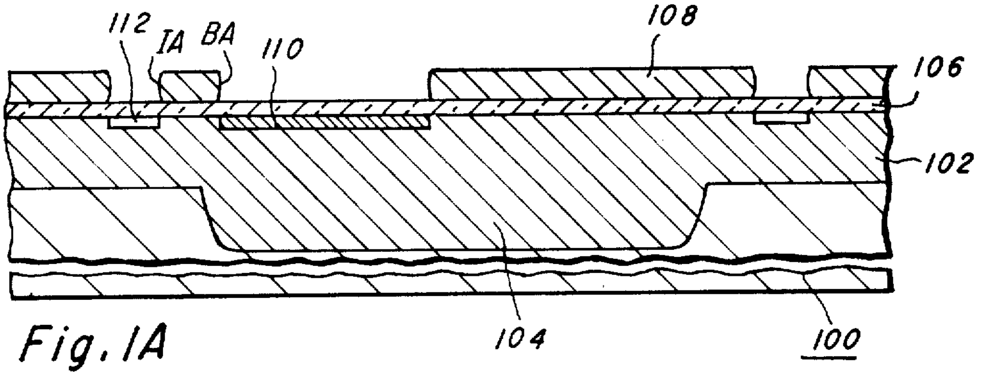

This invention relates to a method of fabricating semiconductor devices, especially integrated circuit structures utilizing ion implantation techniques.

In the manufacture of integrated circuits, particularly bipolar integrated circuits, several photomasking operations are used to define apertures in a masking layer overlying a surface of a semiconductor substrate for formation of semiconductor regions and interconnections therebetween during fabrication of the integrated circuit. Typically the masking layer is an insulating material, e.g., silicon oxide, and the aperture definition steps are referred to as O. R. steps. A conventional buried collector, junction isolated bipolar integrated circuit process typically may require at least five O. R. steps to define the various semiconductor regions and interconnections therebetween. The alignment or registration of the various mask levels with respect to each other needs to be controlled within critical tolerances in order to ensure proper operation of the end device, since alignment errors can be cumulative. It has been found that, to a first order approximation, the slice yield of acceptable electrical circuits is an inverse function of the number of O. R. steps involved during processing of the slice. Furthermore, the integrity of the metal interconnections between the various semiconductor regions is very dependent upon the number, size, and shape of the steps or discontinuities in the insulating layer resulting from the several removals of portions thereof. Consequently, it is very desirable to provide a relatively simple process that would have few oxide removals and small surface discontinuities and thus permit integrated circuits having high complexity to be manufactured while maintaining a high yield factor of acceptable end circuits.

Accordingly, it is an object of this invention to provide an improved process for fabricating semiconductor devices, particularly integrated circuits, wherein critical alignment steps are reduced.

It is a further object of the invention to provide an improved process for fabricating integrated circuits which results in a substantially flat surfaced insulating layer on which reliable interconnections between semiconductor regions may be defined.

Accordingly, one aspect of the invention involves a method of fabricating a semiconductor device, particularly an integrated circuit, including a semiconductor substrate of one conductivity type having a semiconductor layer of opposite conductivity type thereon. Typically, the semiconductor substrate may be p-type silicon and the semiconductor layer may be an n-type epitaxial layer. The method includes the steps of forming a substantially flat surfaced layer of insulating material, suitably silicon oxide, over the semiconductor layer. A mask definition layer, suitably photoresist, is then formed on the insulating layer to delineate an inner area within and spaced from a surrounding closed contour area. Dopant ions of said one conductivity type are implanted through the insulating layer into surface areas of the semiconductor layer beneath the said closed contour and inner areas delineated by the mask definition layer, thus forming a closed contour surface region and an inner region of said one conductivity type in the semiconductor layer. During this implantation step, the mask definition layer provides a barrier against implantation of the dopant ions therethrough. The inner area delineated by the mask definition layer is then covered with implantation barrier material, suitably, photoresist, and further dopant ions of said one conductivity type are implanted through the insulating layer into the semiconductor layer to extend the closed-contour surface region of one conductivity type completely through the thickness of the semiconductor layer. The mask definition layer and the barrier material provide a barrier against implantation of the dopant ions therethrough. The mask definition is then completely removed from the insulating layer and preferably the insulating layer may be lightly surface etched to provide a surface pattern thereon corresponding to the closed contour doped region and the inner doped region due to the enhanced etch rates of the implanted portions of the insulating layer. Since these surface patterns are very shallow, the surface of the insulating layer remains substantially flat.

A second mask definition layer, again suitably photoresist, is then defined on the insulating layer, and areas of the insulating layer are removed to delineate self-aligned areas within said closed contour region and having predetermined positional relations with the inner and closed contour regions of one conductivity type, a first and second spaced self-aligned areas being located over an area of the inner doped region of one conductivity type and a third self-aligned area being located over an area of the semiconductor layer. The surface pattern referred to above, assists accurate achievement of the predetermined positional relationship of the self-aligned areas with respect to the inner doped region. The second self-aligned area is covered with implantation barrier material, e.g., photoresist, and dopant ions of said opposite conductivity type are then implanted through the first and third self-aligned areas of the insulating layer to form a first and second doped surface regions of opposite conductivity type in said inner region and the semiconductor layer respectively. The second mask definition layer may then be removed to uncover the substantially flat surfaced insulating layer.

In fabrication of a bipolar integrated circuit device by the process set forth in the preceding paragraph, the closed contour region of one conductivity type may define an isolation region and the semiconductor layer of one conductivity type within the isolation region may provide the collector region of a transistor and preferably, a so-called buried-layer of said opposite conductivity type would previously have been formed in the semiconductor substrate beneath the area of the semiconductor layer of opposite conductivity type bounded by the isolating region. The inner region of the said one conductivity type referred to is used to provide the base region of the transistor while the first and second self-aligned areas are used for definition of an emitter region and a base contact-area, respectively, for the transistor, while the third self-aligned area would define a collector contact region. It will be observed that by use of such a process, only one O. R. step is required after formation of the semiconductor layer of opposite conductivity type (epitaxial layer) and that the only significant steps or discontinuities in the surface of the insulating layer occur where contacts are to be formed to the various semiconductor regions. Consequently, an improved packing density may readily be achieved as compared with conventional fabrication processes, since critical alignments with respect to the isolation region are defined during a single masking step. Furthermore, due to the excellent definition of semiconductor regions possible by use of the process of the present invention, improvements in performance of integrated circuits can be obtained, particularly in relation to switching speed of transistors thereby making the process very useful for fabrication of high speed logic circuits, e.g., TTL and ECL logic circuits.

For a better understanding of the present invention, together with identification of further advantages thereof, reference will be made to the following description of a preferred embodiment of the invention together with the accompanying drawings, wherein:

FIGS. 1A–1F show a partial section of a semiconductor slice at various stages of a process embodying the present invention.

For the purpose of illustration, the following embodiment will be described with reference to fabrication of a transistor in an integrated circuit, it being appreciated that a multiplicity of such transistors, as well as other circuit elements, e.g., diodes and resistors, would also be formed along with the transistors, such circuit elements being located within isolation regions as desired with respect to particular circuit design constructions. Furthermore, the following description will be made with reference to use of silicon as the semiconductor material and silicon oxide as an insulating material. However, it is to be understood that other semiconductor materials, e.g., germanium and compound semiconductors, could be used in place of silicon and that insulating materials other than silicon oxide, e.g., silicon nitride and aluminum oxide, could be used in place of silicon oxide.

Referring to FIG. 1A, as starting material, a p-type silicon slice 100 having a resistivity of 10 ohm-cm, for example, is used having an epitaxial layer 102 of approximately 0.5 ohm-cm resistivity and 1-1.5 microns thickness, with n-type buried layers such as 104 diffused into the silicon substrate beneath areas where transistors are to be formed in the epitaxial layer, to reduce collector resistance and limit epitaxial layer-to-substrate leakage currents. The epitaxial layer preferably is deposited at a temperature not exceeding 1,050°C using known techniques to prevent significant removal of the diffused arsenic from the buried layers. To this point, the processing steps are known in the art and further description thereof is not required.

Commencing with a semiconductor structure as above described, a flat surfaced layer of silicon oxide 106 is thermally grown at a suitably low temperature, e.g., 950°C, on the surface of the epitaxial layer 102 to a thickness of approximately 2,000A. (FIG. 1A) A mask definition layer of photoresist masking material 108 is then applied over the surface of the insulating layer 106 and apertures defined therein corresponding with all isolation and base regions required in the integrated circuits. These apertures are all defined using one mask and thus are self-aligned with a high degree of accuracy. Suitable photoresist materials are KODAK Microresist 747; Hunt Chemical Co. WAYCOAT III Resist and SHIPLEY AZ1350H Resist.

For the purpose of the present description, in FIG. 1A, one such base region aperture BA and one isolation area IA only are shown, it being noted that the aperture BA is located over the buried layer 104 while the aperture iA surrounds the buried layer 104. The base aperture BA may suitably be circular or rectangular in shape while the isolation area has a closed contour, e.g., rectangular or circular. Definition of the apertures BA and IA involves no removal of the silicon oxide layer 106. The masked structure, shown in FIG. 1A, is then subjected to an ion implantation step wherein p-type impurity ions, e.g., boron ("$B^+$"), are implanted into the epitaxial layer 102 through the areas of the silicon oxide layer 106 uncovered by the apertures BA and IA, suitably using a dosage of $1.5 \times 10^{14}$ ions/cm$^2$ at 80 keV to define a base region 110 for the transistor in the surface of the epitaxial layer 102 and also to provide a closed contour surface region 112 beneath the aperture IA. The dopant ions penetrate the areas of the silicon oxide layer 106 within the apertures BA and IA but are masked by the photoresist layer 108 which has a thickness, e.g., about 1.2$\mu$, suitable to provide a barrier against implantation of the dopant ions therethrough.

Figure 1B:
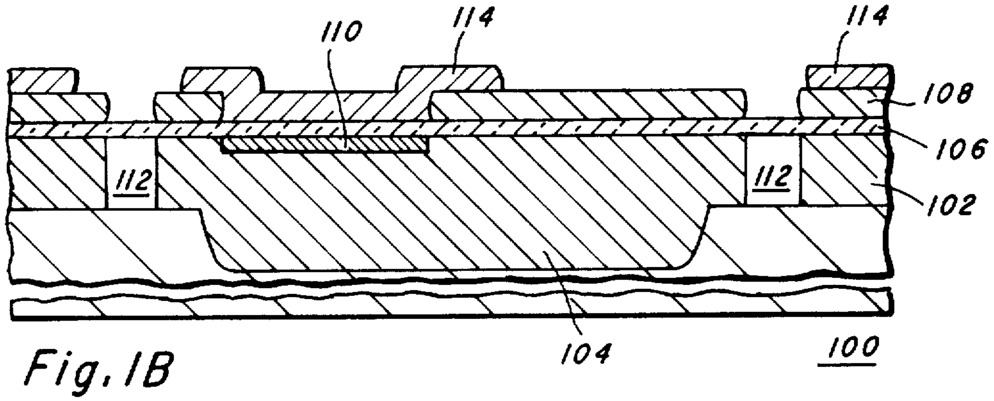

The aperture BA in the photoresist layer 108 is then covered with implantation barrier material 114, preferably photoresist material, so that only the isolation apertures such as IA are exposed. Again, no removal of the silicon oxide layer 106 is required and no critical alignment is required in placement of the photoresist material 114, since an oversize aperture is defined in the photoresist layer 114 to uncover the aperture IA in the photoresist layer 108. The structure, shown in FIG. 1B, is now subjected to a further ion implantation of p-type dopant ions, suitably using a boron ("$B^+$") dose of $1.5\times 10^{15}$ ions/cm$^2$ at 200keV. The photoresist layers 114 and 108 mask against dopant implantation into regions of the epitaxial layer other than through the apertures IA. As a result of this implantation step, the region 112 is extended completely throughout the thickness of the epitaxial layer 102 to provide an isolation region, having a relatively low sheet resistivity.

The photoresist layer 108 and photoresist material 114 are then removed by conventional stripping techniques and the surface of the silicon oxide layer 106 is then subjected, without masking, to a brief etch in a dilute-hydrofluoric acid (HF) to remove a maximum of about 500A of the silicon oxide layer 106. The areas of the silicon oxide layer 106 through which ion implantation has occurred, corresponding to the apertures BA and IA as shown in FIG. 1B, are removed more rapidly than other areas of the silicon oxide layer and consequently shallow steps 116 (300A maximum) are formed in the silicon oxide layer corresponding with the areas of the base regions 110 and the isolation region 112. (FIG. 1C) These shallow steps 116 assist in achieving correct alignment between emitter, base contact and collector contact regions with respect to the base region 110, as will subsequently be described. This etch step may be performed before removal of photoresist layers 108, 114 so as not to remove any field oxide, if so desirable.

Figure 1C:
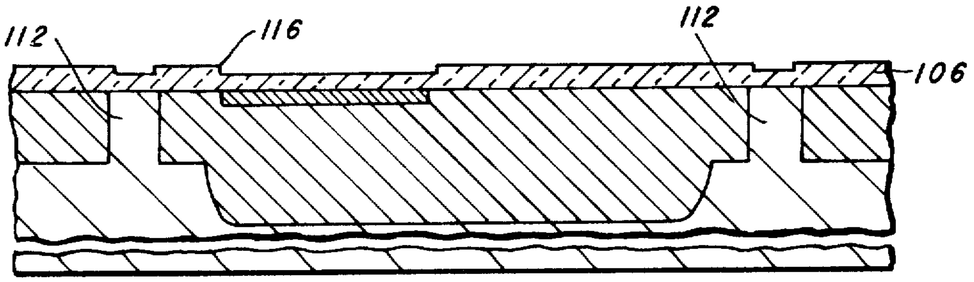

The structure, shown in FIG. 1C, is next subjected to a brief phosphorous deposition and oxidation which provides PSG (Phosphosilicate Glass) stabilization and impurity gettering; anneals the damage to the silicon oxide layer 106 and the epitaxial layer 102 caused by the implantation steps; and electrically activates the boron ions implanted in the base region 110 and the isolation region 112; an increase in thickness of the silicon oxide layer 106 to about 2,500A also occurs.

Fabrication of other circuit elements utilizes fabrication steps as described above in relation to fabrication of the transistor. Thus, for example, resistor region could be implanted concurrently with implantation of the base region of the transistor and contacts made at opposite ends of the resistor, which might have a straight or serpentine path. Junction diodes normally would be provided by fabricating a transistor and using the base-emitter, base-collector or emitter-collector junction for the diode.

Figure 1D:
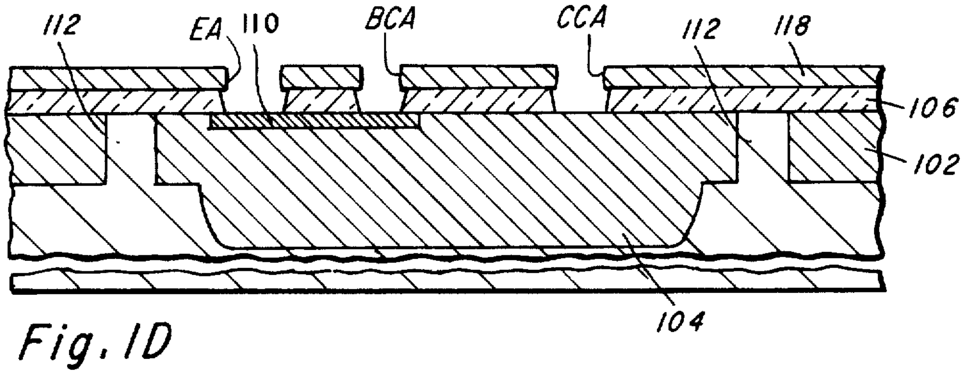

Another mask definition layer of photoresist 118 is then applied to the surface of the silicon oxide layer 106 and is patterned in correspondence with emitter, base contact, collector contact, Schottky diode, resistor and other circuit element region areas as desired. As shown in FIG. 1D, the photoresist layer 118 has been patterned with apertures EA, BCA and CCA corresponding to emitter, base contact and collector contact areas. Alignment of the mask required to define these areas in the photoresist layer is critical but is assisted by the shallow step regions 116 previously formed in the silicon oxide layer 106. Areas of the silicon oxide layer 106 are removed, using conventional etching techniques, in areas corresponding to the apertures EA, BCA and CCA formed in the photoresist area 118. Since the surface of the oxide layer 106 is substantially flat, (the steps 116 being very shallow) a relatively thin, e.g., ~°.3 microns. photoresist layer 118 may be used in order to improve the definition of the apertures to be formed in the silicon oxide layer 106. Proper alignment of the emitter aperture within the area of the base region 110, assures alignment of the collector contact aperture with respect both to the base region 110 and the isolation region 112 since those regions are self-aligned with respect to each other, having been defined on the same mask level as previously described with reference to FIG. 1B.

The photoresist layer 118 is preferably stripped (this is not essential and implantation barrier material, preferably photoresist material is applied and patterned to form a barrier region 120 covering the base contact aperture BCA. This step involves no additional etching of the silicon oxide layer 106 and mask alignment is not critical.

Figure 1E:
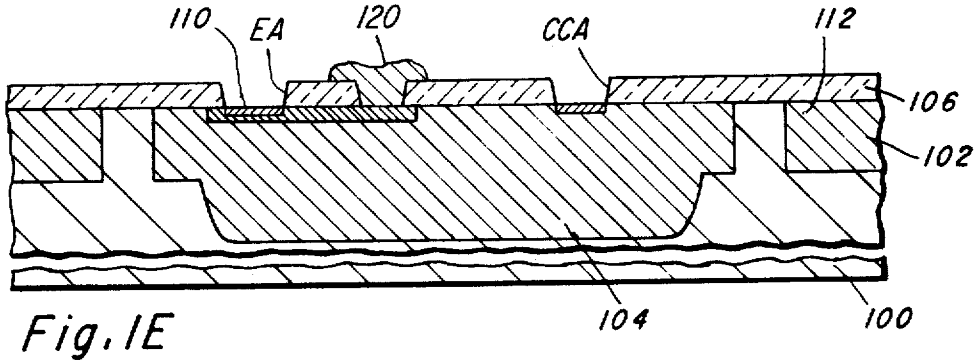

The resultant structure as shown in FIG. 1E is then subjected to implantation of n-type dopant ions through the apertures EA and CCA, suitably using arsenic as the dopant impurity with a dosage of $5 \times 10^{15}$ ions/$cm^2$ at 60 keV to form an n-type emitter region 122 and an n-type collector contact region 124. Implantation into other areas of the epitaxial layer is prevented by the barrier provided by insulating layer 106 and the overlying photoresist material 120.

Figure 1F:
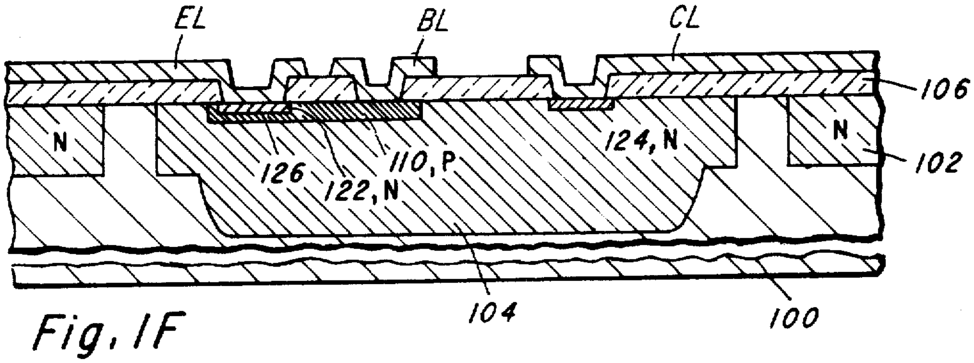

The photoresist area 120 is then removed using conventional stripping techniques, resulting in a structure as shown in FIG. 1F. This structure is then placed in a non-oxidizing ambient, for example nitrogen at 1,000°C for 15 minutes, to anneal and diffuse the implanted emitter region 122. This step also results in slight lateral diffusion of the emitter region so that the baseemitter junction 126 terminates at the surface of the epitaxial layer beneath the silicon oxide layer 106.

Metal contacts and interconnections can be provided in conventional manner on the surface of the silicon oxide layer 106 using conventional processing involving cleaning the exposed surface areas of the emitter region 122, the collector contact region 124, the base contact area and of the isolation region 112, application of metallization, preferably using a metal system that reduces alloying at the silicon-metal interface, and patterning to define interconnections and contacts extending into ohmic contact with the emitter (contact EL), base (contact BL) and collector contact regions (contact CL), through the apertures in the silicon oxide layer 106. The surface of the silicon oxide layer 106 is virtually flat and thus very suitable for definition single or multi-level interconnection systems.

In a conventional fabricating process using phosphorous as an n-type diffusant, at an elevated temperature, the edges of the emitter aperture in the silicon oxide layer are converted to a phosphorous glass composition during diffusion of the emitter region, and when the slice is subjected to a clean-up etch prior to formation of the metal contact and interconnect system, those edges are etched away at a relatively rapid rate giving rise to the danger of exposure of the base-emitter junction, and consequently, short circuiting thereof when the metal contacts are applied. It is to be noted that using a process embodying the present invention, the silicon oxide layer is not exposed to any impurity diffusion step after the emitter O. R. and consequently such danger of short circuiting of the base-emitter junction 126 upon application of the emitter contact is avoided.

A method embodying the present invention is also advantageous in that spacing between active components and the surrounding isolation region can be made minimal since there is very little lateral diffusion from the implanted isolation region, and thus packing density in integrated circuits can be improved using a process embodying the invention.

Furthermore, the emitter region 122 can be made very small, e.g., a width of a few microns or less, dependent on the accuracy achieved in the photoresist patterning, and a depth of about 2000A, thereby giving rise to superior high speed transistor performance (e.g., $F_T > 2000$MHz).

What is claimed is:

1. A method of fabricating a semiconductor device including a semiconductor substrate of one conductivity type having semiconductor layer of opposite conductivity type thereon, including the steps of:

a. forming a substantially flat surfaced layer of insulating material on said semiconductor layer;

b. forming a first single mask definition layer on said insulating layer to delineate an inner area within and spaced from a surrounding closed contour area;

c. implanting dopant ions of said one conductivity type through said flat surfaced insulating layer into surface areas of said semiconductor layer beneath said closed contour and inner areas delineated by said masking layer to form a closed contour surface region and an inner region of said one conductivity type in said semiconductor layer, said mask definition layer providing a barrier to implantation of said dopant ions therethrough;

d. covering said first mask layer and inner area with an implantation barrier material layer having at least one aperture therein positionally corresponding to but oversize in relation to said closed contour area, and implanting further dopant ions of said one conductivity type through said insulating layer into said semiconductor layer to extend said closed-contour surface region of said one conductivity type completely through the thickness of said semiconductor layer, said mask definition layer and said implantation barrier material providing a barrier against implantation of said dopant ions therethrough;

e. uncovering said insulating layer and forming a second mask definition layer on the same said insulating layer to delineate self-aligned areas within said closed contour region having a predetermined positional relation with said inner region of one conductivity type, first and second ones of said self-aligned areas located over spaced areas of said inner region of said one conductivity type and a third said self-aligned area located over an area of said semiconductor layer;

f. covering said second self-aligned area with an implantation barrier layer and implanting dopant ions of said opposite conductivity type through said first and third self-aligned areas to form a first doped surface region of said opposite conductivity type in said inner region of one conductivity type and a second doped region of opposite conductivity type in said semiconductor layer; and g. uncovering said substantially flat surfaced insulating layer.

2. A method according to claim 1, wherein during said step (e) following uncovering of said insulating layer but before formation of said second mask definition layer, the said insulating layer is surface etched to provide a shallow surface pattern thereon corresponding to the closed contour doped region and said inner doped region for assisting achievement of said predetermined positional relation of said self-aligned areas with respect to said inner region.

3. A method of fabricating an integrated circuit semiconductor device including a semiconductor substrate of one conductivity type having an epitaxial layer of opposite conductivity type thereon, including the steps of:

a. forming a flat surfaced layer of insulating material on said epitaxial layer;

b. forming a first mask definition layer of said insulating layer to delineate an inner area within and spaced from a closed contour area;

c. implanting dopant ions of said one conductivity type through said flat surfaced insulating layer into surface areas of said semiconductor layer beneath said closed contour and inner areas respectively delineated by said mask definition layer to form a closed contour surface region and an inner surface region of said one conductivity type in said semiconductor layer, said inner surface region defining a base region for a transistor;

d. covering said first mask definition layer and said inner area with an implantation barrier layer having at least one aperture therein positionally corresponding with but of larger size than said closed contour area, and implanting dopant ions of said one conductivity type through said insulating layer into said semiconductor layer beneath said closed contour area to form a closed contour isolation region of said one conductivity type extending throughout the thickness of said epitaxial layer, said mask definition layer and said barrier layer providing barriers against implantation of said dopant ions therethrough;

e. uncovering said insulating layer and forming a second mask definition layer on said insulating layer to delineate self-aligned areas within said closed contour isolation region, said self-aligned areas having a predetermined positional relation with said base region such that first and second self-aligned areas are located over said base region and a third self-aligned area is located over an area of said epitaxial layer;

f. covering said second self-aligned area with an implantation barrier layer and implanting dopant ions of said opposite conductivity type through said first and third self-aligned areas to form an emitter region of said opposite conductivity type in said base region and a collector contact region of said opposite conductivity type in said epitaxial layer.

4. A method according to claim 3, wherein during said step (e) following uncovering said insulating layer but before formation of said second mask definition layer, said insulating layer is subjected to a differential surface etch to provide a shallow surface pattern thereon corresponding to the areas of said closed contour doped region and said base region for achieving said predetermined positional relation of said first, second and third self-aligned areas with respect to said base region.

5. A method according to claim 3, wherein said isolation region is formed to surround a heavily doped surface region of said opposite conductivity type defined in the said semiconductor substrate contiguous with said epitaxial layer and providing part of the collector region of said transistor.

6. A method of forming an integrated circuit semiconductor device including a silicon substrate of one conductivity type having a heavily doped surface area of opposite conductivity type and an epitaxial layer of said opposite conductivity type on said silicon substrate overlying said heavily doped surface region, including the steps of:

a. forming a substantially flat surfaced layer of silicon oxide on said epitaxial layer;

b. forming a first mask definition layer on said silicon oxide layer, said mask definition layer having self aligned apertures therein delineating on said silicon oxide layer an inner area within and spaced from a closed contour area surrounding said heavily doped surface region;

c. implanting dopant ions of said one conductivity type through said closed contour and inner areas of said silicon oxide layer to define corresponding doped surface regions of said one conductivity type in said epitaxial layer, the doped region of said one conductivity type beneath said inner area providing a base region for a transistor;

d. covering said first mask layer and said inner area of said insulating layer with an implantation barrier layer having at least one aperture therein positionally corresponding to but oversize with respect to said closed contour area, and implanting further dopant ions of said one conductivity type through said closed contour area of said silicon oxide layer to extend said closed contour region completely through the thickness of said epitaxial layer and thereby providing an isolation region;

e. uncovering said silicon oxide layer and forming thereon a second mask definition layer;

f. removing areas of said silicon oxide layers corresponding with first, second and third self-aligned areas of said second mask layer, said first and second self-aligned areas located over spaced areas of said base region and said third self-aligned area being located over an area of said epitaxial layer overlying said heavily doped region of opposite conductivity type in the silicon substrate;

g. covering said second self-aligned area with an implantation barrier layer;

h. implanting dopant ions of said opposite conductivity type through said first and third self-aligned areas to form an emitter region of said opposite conductivity type in said base region and a collector contact region of said opposite conductivity type in said epitaxial layer, said barrier layer providing barrier against implantation of said dopant ions therethrough;

i. uncovering said substantially flat surface silicon oxide layer; and j. heating the resultant structure in a non-oxidizing atmosphere to anneal at least said implanted emitter region.

7. A method according to claim 6, wherein during said step (e) following uncovering said silicon oxide layer but before forming said second mask definition layer, the silicon oxide insulating layer is subjected to a mask-free surface etch to define shallow patterns therein corresponding with said isolation region and said base region to assist in obtaining said predetermined positional relationship between said first, second and third self-aligned areas and said base region.

8. A method according to claim 7, wherein following said surface etching of said silicon oxide layer, the structure is heat treated to anneal damage caused by said implantation steps.

9. A method according to claim 6, wherein said one conductivity type is p-type and said opposite conductivity type is n-type.

10. A method according to claim 9, wherein said dopant ions of one conductivity type are boron ions and said dopant ions of said opposite conductivity type are arsenic ions.

11. A method according to claim 6, wherein said mask definition layers and said implantation barrier layer comprise photoresist material.

12. A method according to claim 6, including the additional steps of forming metal contacts extending through said first, second and third self-aligned apertures in the flat surfaced silicon oxide layer to provide emitter, base and collector contacts for said transistor.

13. A method according to claim 6, wherein said step (d) is effected using a higher dopant dosage than a said step (c) and a lower dopant dosage than in said step (h).

14. A method according to claim 6, wherein ion implantation during said step (d) is effected using an ion energy level higher than in said step (c) or in said step (h).

* * * * *